United States Patent [19]

Kutal

[11] Patent Number: 5,877,230
[45] Date of Patent: Mar. 2, 1999

[54] ANIONIC PHOTOINITIATION

[75] Inventor: Charles R. Kutal, Athens, Ga.

[73] Assignees: University of Georgia Research Foundation, Inc.; The University of Georgia, Athens, Ga.

[21] Appl. No.: 900,815

[22] Filed: Jul. 25, 1997

Related U.S. Application Data

[63] Continuation of Ser. No. 243,768, May 17, 1994, Pat. No. 5,652,280, which is a continuation-in-part of Ser. No. 790,355, Nov. 12, 1991, abandoned.

[51] Int. Cl.$^6$ .............................. C08G 2/02; C08F 2/48; C08F 4/80
[52] U.S. Cl. .............................. 522/66; 522/29; 522/148; 522/164; 522/165; 522/166; 522/162; 522/150; 522/173; 522/175; 522/178; 522/182; 522/184; 522/188; 522/189
[58] Field of Search .............................. 522/173, 66, 29, 522/148, 150, 162, 164, 165, 166, 175, 178, 182, 184, 188, 189

[56] References Cited

U.S. PATENT DOCUMENTS

| | | |
|---|---|---|
| 3,794,497 | 2/1974 | Pratt et al. . |
| 4,094,852 | 6/1978 | Sundermann et al. . |
| 4,130,426 | 12/1978 | Takeda et al. . |
| 4,184,874 | 1/1980 | Takeda . |
| 4,364,876 | 12/1982 | Kimura et al. .......................... 522/173 |
| 4,675,270 | 6/1987 | Woods et al. . |
| 4,707,432 | 11/1987 | Gatechair et al. . |
| 4,857,654 | 8/1989 | Reidiker et al. . |
| 4,963,300 | 10/1990 | Meier et al. . |
| 4,985,340 | 1/1991 | Palazzotto et al. . |
| 4,992,572 | 2/1991 | Desobry et al. . |
| 5,059,701 | 10/1991 | Keipert . |
| 5,073,438 | 12/1991 | Meier et al. . |
| 5,091,439 | 2/1992 | Berner et al. . |
| 5,143,785 | 9/1992 | Pujol et al. . |
| 5,215,860 | 6/1993 | McCormick et al. . |
| 5,382,604 | 1/1995 | Erickson ................................. 522/158 |
| 5,514,728 | 5/1996 | Lamanna et al. .......................... 522/66 |
| 5,554,664 | 9/1996 | Lamanna et al. .......................... 522/29 |

OTHER PUBLICATIONS

Aslam et al., "Photopolymerization of Vinyl Monomer Initiated by Diacidobis (Ethylenediamine) Cobalt (III) Complexes," *Polymer Photochemistry,* 5:41–48 (1984).

Delzenne, G.A., et al., "Photopolymerization of Vinyl Monomers Initiated by Pentaaminecobalt (III) Complexes," *J. Polymer Science,* No. 16, pp. 1027–1036 (1967).

Fukuchi, Y., et al., "Photoinitiated Anionic Coordination Polymerization of Epoxides, a Novel Polymerization Process," *Macromolecules,* 20:2316–2317 (1987).

Fukuchi, Y., et al., "Thermo–Initiated Anionic Polymerization of Epoxides Using the Titanium Tetraisopropoxide and Protected Aryl Alcohol System," *J. Polymer Science,* 1988, vol. 25, pp. 269–272.

Fukuchi, Y., et al., "Polymerization of Epoxides Catalyzed by the Titanium Tetraisopropoxide/Phenol System and its Mechanism," *J. Polymer Science,* 1988, vol. 26, pp. 401–403.

Kimura, K., et al., "Photocurable Acrylic Adhesives," *Chem. Abstracts,* 107:24498x (Jul. 27, 1987).

(List continued on next page.)

*Primary Examiner*—Susan W. Berman
*Attorney, Agent, or Firm*—John S. Pratt; Bruce D. Gray; Kilpatrick Stockton

[57] ABSTRACT

A method for the anionic photoinitiation of polymerization or crosslinking of a substrate by irradiating a mixture of a substrate and a photoinitiator, where the photoinitiator is an inorganic transition metal complex which releases on irradiation a polymerization initiating substance consisting essentially of an anionically charged nucleophile that initiates the polymerization or crosslinking reaction, under conditions that allow the anion to initiate polymerization. FIG. 3 is plot of percentage polymerization of ethyl α-cyanoacrylate containing different concentration of Reineckate's anion.

26 Claims, 2 Drawing Sheets

OTHER PUBLICATIONS

Korshak, V.V., "Photoinitiation of Polymerization of Ethyl a–cyacoacrylate," *Chem. Abstracts,* 100:7215r (Jan. 9, 1984).

Kutal, et al., "New Inorganic Photoinitiators for Deep–UV Resist Material," *Journal of Coating Technology,* vol. 62, No. 786 (1990) pp. 63–67.

Kutal, et al., "Novel Base–Generating Photoinitiators for Deep–UV Lithography," *SPIE — The International Society for Optical Engineering,* vol. 1466 (1991) pp. 362–367.

Kutal, et al., "Photoinitiated Cross–Linking and Image Formation in Thin Polymer Films Containing a Transition Metal Compound," *Journal of the Electrochemical Society,* vol. 134, No. 9 (1987) pp. 2280–2285.

Lewis, F.D., et al., "Electronic Structure and Spectroscopy of Nickel (II), Palladium (II), Acetylacetonate Complexes," *Inorg. Chem.,* 32:1251–1258 (1993).

Natarajan, L.V., et al., "Polymerization of Acrylamide and Methacrylamide Photoinitiated by Azidopentamminecobalt (III) Chloride," *J. Polymer Science,* vol. 6, 3245–3257 (1968).

Polyakova, A.M., "Effect of Impurities on the Photochemical Polymerization of Ethyl α–Cyanoacrylate," *Chem Abstracts,* 106:33490v (Feb. 9, 1987).

Said–Galiev, E.E., et al., "Temperature Dependence of the Photopolymerization Rate of Ethyl a–Cyanacrylate," *Chem. Abstracts,* 100:34900s (Feb. 6, 1984).

Uchida, Y. et al., "Photoinitiated Anionic Coordination Polymerization of Epoxides, a Novel Polymerization Process," *Macromolecules,* 1987, vol. 20, pp. 2316–2317.

*Principles of Polymerization* by George Odian, 2nd Ed. (1991) pp. 372–402.

"Anionic Polymerization to Cationic Polymerization," *The Encyclopedia of Polymer Science and Engineering,* John Wiley & Sons, New York, (1985) vol. 2, pp. 1–42.

Curtis, Hilary, et al., "Organometallic Photoinitiated Polymerisations," *University Chemical Laboratory,* Lensfield Road, Cambridge CB2 1RL.

ANIONIC PHOTOINITIATION

This application is a continuation of application U.S. Ser. No. 08/243,768, filed May 17, 1994, now U.S. Pat. No. 5,652,280, which is a continuation-in-part of U.S. Ser. No. 07/790,355 filed Nov. 12, 1991, now abandoned.

The government has rights in this invention by virtue of the partial funding of work leading to this invention through National Science Foundation Grant No. DMR-8715635.

BACKGROUND OF THE INVENTION

Photoinduced reactions of functionalized monomers, oligomers, and polymers play a prominent role in technologies that contribute an estimated $25 billion per year to the world economy. Important commercial applications include the ultraviolet curing of coatings, the photoimaging of semiconductor chips, and the light-driven storage and output of visual information.

Photochemical or photoinitiated reactions occur when a reactive species is produced on exposure of the reaction mixture to light. The simplest mechanism for processes of this type involves the direct photochemical conversion of a substrate to a final product (eq. 1). If the substrate does not absorb the incident radiation, or does not form a reactive intermediate on exposure to the radiation, a second compound, referred to as (1)

(2)

(3)

a photoinitiator (P), can be added that absorbs incident light strongly and undergoes a photochemical transformation to one or more reactive species I (eq. 2). Interaction of I with the substrate results in product formation (eq. 3). Since the photoinitiator and substrate serve different functions, it is possible to optimize the properties of one without affecting the desirable features of the other. This inherent flexibility of a two-component system greatly simplifies the task of designing radiation-sensitive materials.

The species (I) can function as a true catalyst of reaction and suffer no permanent change in composition. Alternatively, (I) can be consumed while initiating a chain reaction of the substrate. Since, in either case, the reactive species produced by the action of a single photon may result in the conversion of several substrate molecules to product, the effective quantum efficiency (number of product forming events per photon absorbed) can exceed unity. This multiplicative response constitutes chemical amplification of the initial photochemical act and affords a means of designing materials with high radiation sensitivity.

The majority of commercially important photoinitiators are nonmetallic compounds that generate radicals and/or strong acids upon irradiation. Well-studied examples include benzoin and benzoin ethers, benzyl ketals, benzophenones plus hydrogen atom donors, thiol-ene systems, and onium salts belonging to the aryldiazonium, triarylsulfonium, and diaryliodium families. Of the relatively few transition metal-containing photoinitiators reported to date, most are organometallic complexes possessing photolabile ligands such as carbon monoxide, olefins, and carbocyclic rings. While the details of the mechanisms of initiation in these systems are sketchy, the photoinduced formation of a coordinatively unsaturated metal center appears to be a central feature.

The ability of classical metal ammine complexes to function as photoinitiators has been reported by Kutal, et al. In the *Journal of the Electrochemical Society*, Vol 134(9), 2280, 1987, Kutal and Willson reported that films spin-coated from solutions containing the copolymer of glycidyl methacrylate and ethyl methacrylate along with the transition metal coordination complex, $[Co(NH_3)_5Br](ClO_4)_2$ undergo crosslinking upon irradiation at 254 nm and subsequent heating at 70° C. The mechanism of crosslinking was determined to proceed in two distinct stages: (i) the primary photochemical process involving redox decomposition of the cobalt complex; and (ii) one or more thermally activated reactions between the decomposition products and the pendant epoxide groups on the copolymer. The reactive species responsible for the photoinduced crosslinking by $[Co(NH_3)_5Br](ClO_4)_2$ was not elucidated in this work, but it was hypothesized to be either a released ammonia molecule (neutral base catalysis) or cationic cobalt (II) complex (cationic catalysis).

In the *Journal of Coatings Technology*, July 1990, Kutal, Weit, MacDonald and Willson reported that $Co(NH_2R)_5X^{n+}$ complexes, where R is methyl or n-propyl and X is $Cl^-$ or $Br^-$, photoinitiate crosslinking reactions in films of the copolymer of glycidyl methacrylate and ethyl acrylate at 254 nm. Irradiation of the cobalt complex at this wavelength causes efficient photoredox decomposition of the complex from a ligand-to-metal charge transfer excited state with release of several equivalents of free alkylamine. Even in the presence of oxygen, the decomposition quantum yields in solution can exceed 40%. The quantum yields for the alkylamine cobalt complexes are uniformly higher than those reported for the comparable ammonia complexes. It was also observed that $Co(NH_2Me)_5X^{2+}$ exhibits a greater photosensitivity than $Co(NH_3)_5X^{2+}$ in the crosslinking reaction, suggesting that the initiating species is the substituted amine or ammonia (neutral base catalysis), and that the sensitivity is a function of the basicity of the amine. See also *Advances in Resist Technology and Processing VIII*, Volume 1466 (1991).

U.S. Pat. No. 3,794,497 to MacDonald, et al. discloses a means for recording an image which includes subjecting to light a layer that includes a vitamin $B_{12}$ derivative and a polymerizable monomer. The invention appears to be based on the knowledge that vitamin $B_{12}$, which contains an alkyl-cobalt bond, releases an alkyl radical on exposure to light (see column 2, lines 53–63). The patent also describes models of vitamin $B_{12}$ which apparently do the same, or release an aryl radical (see column 3 and column 4, lines 1–13). The inventive aspect of the '497 patent appears to be the recognition that these types of vitamin $B_{12}$ derivatives could be used as free radical initiators in image-recording processes.

Aslam, *Polymer Photochemistry* 5 41–48 (1984), reports that diacidobis(ethylenediamine)cobalt (III) complexes can cause the photopolymerization of vinyl monomers. Aslam states on page 42 of the article that irradiation results in the formation of radicals from the ligand, and therefore, polymerization proceeds by a radical mechanism, not an anionic mechanism. This point is underscored by Aslam's need to work in deaereated solution lit since, as noted above, oxygen inhibits radical reactions. Moreover, the polymerization was conducted in acidic solution, a medium that inhibits anionic polymerization.

Natarajan and Santappa, "Polymerization of Acrylamide and Methacrylamide Photoinitiated by Azidopentamminecobalt(III) Chloride", *Journal of Polymer Science, Part A-1*, Vol 6, 3245–3257 (1968), describe the kinetics of polymerization of acrylamide and methacrylamide photoinitiated by azidopentamminecobalt(III) chloride in aqueous acidic media. Under the experimental conditions employed, no photoaquation (i.e. release of azide anion) was observed, yet photopolymerization still occurs. Addition of azide anion had a negligible effect upon the rate of photopolymerization. The chloride ion, the anion that would be photogenerated in the system investigated by Aslam, is present as the counter-ion in the Natarajan complex and had no effect on the rate of polymerization. The authors state that initiation is photochemical in nature.

Conspicuously absent from the current catalogue of photoinitiators are those that undergo photochemical release of an anionic initiating species. Such an initiator would be of great value to induce light-catalyzed polymerization or crosslinking of a wide range of monomers, oligomers and polymers. For example, aldehydes and ketones, as well as certain ethylenically unsaturated monomers, undergo anionic polymerization or crosslinking, including ethylene, 1,3-dienes, styrene and α-methyl styrene, acrylates and methacrylates, acrylonitrile, methacrylonitrile, acrylamide and methacrylamide. Certain monomers also undergo anionic ring-opening polymerization or crosslinking reactions, including N-carboxy-α-amino anhydrides, cyclic amides, cyclic esters, epoxides and siloxanes.

Since anion-initiated polymerization is generally less sensitive to inhibition by oxygen ($O_2$) than is radical initiated polymerization, it is a preferred process for many applications conducted in the ambient atmosphere. One of the goals of this invention is to develop polymerization methods that do not involve free radicals as polymerization initiating species.

In light of this, it is an object of the present invention to provide photoinitiators for anionic polymerization or crosslinking.

It is another object of the present invention to provide a method to select compounds for use as anionic photoinitiators.

SUMMARY OF THE INVENTION

It has been discovered that irradiation of selected transition metal complexes can result in the controlled release of anionic initiators for photoinduced reactions of functionalized monomers, oligomers, and polymers.

A method for selecting inorganic transition metal complexes for use as anionic photoinitiators is provided that includes choosing complexes that release nucleophilic anions when irradiated with visible or ultra-violet radiation, have high quantum efficiency, are soluble in nonaqueous solvents, and are thermally stable for a reasonable time period.

One preferred inorganic complex for anionic photoinitiation is trans-$[Cr(NH_3)_2(NCS)_4]^-$ (Reineckate anion). The Reineckate anion dissolves readily in a variety of nonaqueous solvents, resists thermal substitution in nonhydroxylic media, and undergoes quantum efficient release of $NCS^-$ (eq. 4) upon ligand-field excitation with near-ultraviolet/ visible light. Photogenerated $NCS^-$ can be used to initiate the polymerization of monomers that can be polymerized under anionic conditions. It can also be used to crosslink polymers. trans-$Cr(NH_3)_2 (NCS)_4^-$ $Cr(NH_3)_2(NCS)_3$ (solvent)$+NCS^-$ (4)

Other preferred inorganic complexes that can be used as anionic photoinitiators are $Pt(acac)_2$ (where acac is acetylacetonate), $(\eta^5-C_5H_5)_2Ru$ and $(\eta^5-C_5H_5)(\eta^5-C_5H_4COR)Fe$ (where R is H, aliphatic, or aryl).

Other inorganic complexes that can be used as anionic photoinitiators include trans-$Cr(en)_2(NCS)_2^+$ and trans-$Cr(en)_2 Cl_2^+$ (en is ethylenediamine).

DETAILED DESCRIPTION OF THE INVENTION

As used herein, the term substrate refers to the compound, monomer, oligomer, or polymer that is acted on by the anionic photoinitiator. In general, the photoinitiator causes a change in the chemical composition and/or physical structure of the substrate, to produce a product (see equations 2–3).

As used herein, the term inorganic complex refers to an inorganic compound that contains a ligand that is capable of being released as a nucleophilic anion on irradiation with light of the appropriate wavelength.

As used herein, the term nucleophile refers to an electron rich moiety that will attack the nucleus of a carbon atom.

The term alkyl, as used herein, unless otherwise specified, refers to a saturated straight or branched hydrocarbon of $C_1$ to $C_{10}$, and specifically includes methyl, ethyl, propyl, isopropyl, butyl, isobutyl, t-butyl, pentyl, cyclopentyl, isopentyl, neopentyl, hexyl, isohexyl, and cyclohexyl.

The terms alkenyl and alkynyl, as used herein, refers to a $C_2$ to $C_{10}$ straight or branched hydrocarbon with at least one double or triple bond, respectively.

The term aryl refers to aromatic hydrocarbyl, such as phenyl, which can be substituted with one or more aliphatic groups.

The term aliphatic refers to a hydrocarbon, typically of $C_1$ to $C_{10}$, that can contain one or a combination of alkyl, alkenyl, or alkynyl moieties, and which can be straight, branched, or cyclic, or a combination thereof.

A method for anionic photoinitiation is provided that includes exposing the substrate to be polymerized or crosslinked to an inorganic transition metal complex that releases anions in a controlled fashion when irradiated. The metal complex is thermally stable, soluble in the reactants, and nonreactive in the absence of light.

The anionic photoinitiators can be used to prepare new classes of photoresponsive materials possessing optimal properties for specific applications, such as improved thermal stability, photosensitivity, and wavelength response. Such materials are needed in the microelectronics, coatings, and reprographic industries, specifically for lithographic photoresists, photocurable coatings, stereolithographic media, sealants, printing inks and adhesives.

The anionic photoinitiation of selected substrates can be characterized by absorption and luminescence spectroscopies, real-time Fourier transform infrared spectroscopy, quantum yield measurements, flash photolysis, reactive-ion-etching, and scanning electron microscopy.

Anionic polymerization itself has been known, extensively described, and well categorized in the literature for years. Specifically, the conditions under which anionic polymerization occurs, and the conditions under which it is quenched, have been studied and documented. See for example, Principles of Polymerization, by George Odian, Second Edition, 1981, page 372–402; and *The Encyclopedia of Polymer Science and Engineering*, Volume 2, "Anionic Polymerization to Cationic Polymerization," John Wiley and Sons, New York, 1985, pages 1–42. The selection of appropriate reaction systems (solvents and go inhibitors or traps) which promote, inhibit, or prevent anionic radical and other types of polymerizations is also well known.

In one embodiment of the invention, a method for the anionic photoinitiation of polymerization or crosslinking of a substrate is presented that includes the step of irradiating a mixture of a substrate and an inorganic transition metal complex, wherein the inorganic complex releases on irradiation a polymerization initiating substance consisting essentially of an anionically charged nucleophile that initiates the polymerization or crosslinking reaction, under conditions that allow the anion to initiate polymerization. This embodiment does not preclude the presence of radicals or other species in the reaction mixture, but only that the radicals or other species do not significantly initiate polymerization. One of ordinary skill in the art can easily determine which species is being released at a given wavelength, and which species is the polymerization initiating substance. For example, the release of anionic chlorine can be measured with a chlorine ion specific electrode or colorometrically by titration. The release of ethylenediamine can be measured for example by assessing the change in pH over time or by use of reagents that react with amines to produce fluorescent products that can be quantitated. If it is determined that either of these species, for example, is released under the conditions of polymerization, then addition of more of that species ought to have an effect on polymerization.

I. Selection of Inorganic Complex as Anionic Photoinitiator

A. Method of Selection of the Inorganic Complex as an Anionic Photoinitiator

An inorganic transition metal complex should be chosen for use as an anionic photoinitiator that has the following characteristics.

1) The inorganic transition metal complex must release a nucleophilic anion on irradiation. The ability of the complex to initiate anionic polymerization or crosslinking is a function of the nucleophilicity of the released anion and the reactivity of the monomer or other substrate. In general, the nucleophilicity of anions in aqueous or alcoholic solution decreases in the order: $CN^->I^->NCS^->OH^->Br^->N_3^->NO_2^->Cl^{->F-}$. The complex may also release $^-OR$, wherein R is a straight or branched alkyl group, including but not limited to methyl, ethyl, propyl, butyl, and pentyl (linear and branched analogs). This order will change in nonhydroxylic solvents owing to differences in solvation energies.

Metal complexes that photochemically liberate hydroxide ion are particularly attractive, in light of the fact that this strong base is capable of initiating anionic polymerization or crosslinking of epoxides, as well as other moderately reactive species such as siloxanes. For example, addition of $OH^-$ to the oxirane ring produces a reactive anionic species that can then attack a second ring. Repetition of this process results in polymerization or crosslinking with high effective quantum efficiency.

The presence of the anionic species and the use of an anionic mechanism can be easily determined. Successful polymerization, in the presence of a known radical scavenger, such as hydroquinone or oxygen, clearly indicates that a radical mechanism is not involved. Further confirmation of the anionic mechanism is provided by attempts to polymerize the substrate in the presence of an anion scavenger, such as an acid.

2) The release of the anion should be the result of excitation of the inorganic transition metal complex by visible, near-infrared, or ultra-violet light. Light of wavelength between approximately 400 and 750 nm is visible. Light of wavelength between 750 and 1000 nm is considered near-infrared radiation. Light of wavelength between 200 and 400 nm is considered ultraviolet radiation.

Generally, the absorption process causes the transfer of an electron from a molecular orbital with bonding or nonbonding character to a molecular orbital with antibonding character with respect to the central metal-anion bond. In the typical case, the inorganic metal complex undergoes a ligand field or a ligand-to-metal charge transfer transition when irradiated with light of a specific wavelength. The wavelength at which the absorption takes place can be determined by analysis of the complex's ultraviolet, visible, and near-infrared spectrum. For example, ligand-field absorption maxima occur at 392 and 520 nm for trans-$Cr(NH_3)_2 (NCS)_4^-$, at 365, 414 and 487 nm for trans-$Cr(en)_2 (NCS)_2^+$, and at 406 and 619 nm for trans-$Co(en)_2 Cl_2^+$ in aqueous solution.

The ligand field absorbance typically occurs at higher wavelength (lower energy) than the ligand to metal charge transfer band for the lighter transition metals (first and second rows). When transition metal complexes absorb energy in the ligand field region, they release ligands from the complex, but do not normally release free radical species. When transition metal complexes absorb energy in the ligand to metal charge transfer region, the complex releases a number of species, including possibly neutral species, anions, and free radicals. Given this basic knowledge that is elementary to one skilled in the art, appropriate reaction conditions and monomers can be selected to prevent radicals from and allow anions to initiate polymerization.

The ability to initiate useful chemistry when excited with long-wavelength light is a highly desirable feature of transition metal complexes. This can be used, for example, in photosensitive systems that respond to the output of inexpensive semiconductor-diode lasers.

3) The release of the anion from the transition metal complex should occur with high quantum efficiency, preferably 0.01 or larger. The term "quantum efficiency" refers to the ratio of the number of anions generated per photon absorbed by the complex. The numerator in this ratio, the moles of released anion, can be determined by several analytical techniques such as colorimetry, gravimetry, and specific-ion electrode measurements. The denominator of the quantum yield ratio, the moles of absorbed photons, is obtained by measuring the incident light intensity with a calibrated power meter or chemical actinometer such as ferrioxalate and then calculating the percentage of this radiation absorbed by the complex by use of Beer's Law.

Quantum efficiencies for photochemical release of anions from transition metal complexes vary depending upon the complex and reaction conditions. Irradiation of an acetonitrile solution of trans-$Cr(NH_3)_2 (NCS)_4^-$ with 465-nm light causes NCS$^-$ release with a quantum efficiency of 0.26. Photolysis of an aqueous solution of trans-Co(en)$_2$Cl$_2^+$ with 488-nm light generates Cl$^-$ with a quantum efficiency of 0.0011. While quantum efficiencies of anion release near unity are desirable, values as low as 0.0001 may be acceptable in systems that incorporate chemical amplification. The effective quantum efficiency in a chemically-amplified system will be the product of the quantum efficiency of the photochemical step (eq. 2) and the average chain length or number of substrate units reacted per photogenerated initiator/catalyst species (eq. 3).

The number of substrate units undergoing polymerization or crosslinking can be obtained from gel permeation chromatography measurements of number and weight average molecular weights. Consumption of carbon-carbon double bonds in vinylic substrates can be quantitated by real time Fourier transform infrared spectrometry.

Figure 3:
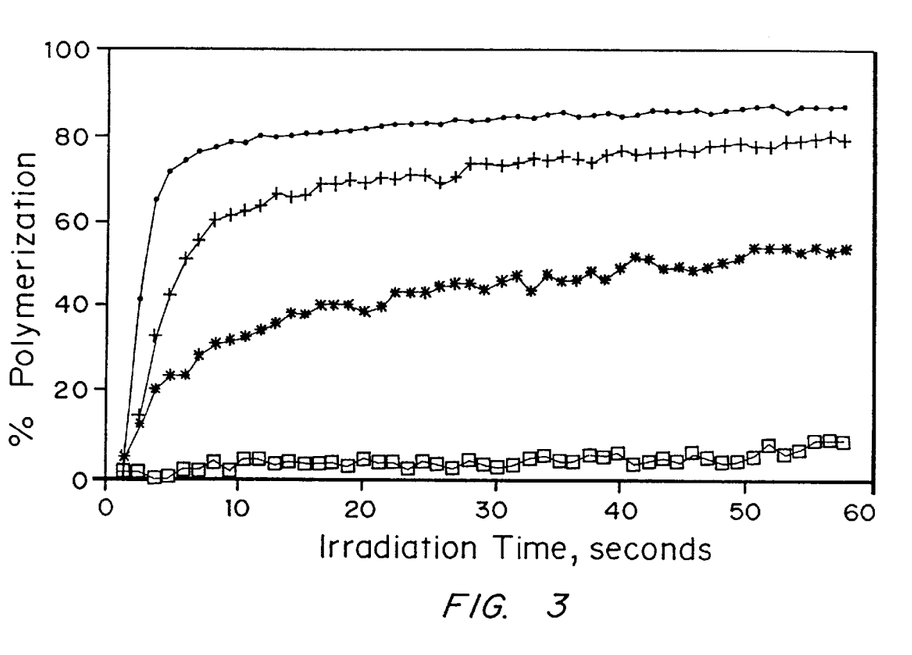
FIG. 3 is a plot of percentage polymerization vs. time of irradiation for samples of ethyl α-cyanoacrylate containing the following concentrations of Reineckate's anion: (□)0M; (*) $2.2\times10^{-4}$M; (+) $5.4\times10^{-4}$M; (■) $2.0\times10^{-3}$M. Samples were coated onto acid-treated silicon wafers and irradiated with 500 mW/cm² of polychromatic (300–630 nm) light.

Example 1 Multiplicity of Response to Reineckate's Anion by Ethyl α-cyanoacrylate FIG. 3 is a plot of percentage polymerization vs. time of irradiation for samples of ethyl α-cyanoacrylate containing the following concentrations of Reineckate's anion: (□) 0M; (*) 2.2×10$^{-4}$M; (+) 5.4×10$^{-4}$MM; (■) 2.0×10$^{-3}$M. Samples were coated onto acid-treated silicon wafers and irradiated with 500 mW/cm$^2$ of polychromatic (300–630 nm) light. Under the rather conservative assumption that each Reineckate's anion in the sample undergoes photochemical release of one NCS$^-$, a polymerization chain length of >10$^4$ was calculated from the data in FIG. 1 for the 2.2×10$^{-4}$M sample after irradiation for 30 seconds. This multiplicative response of ethyl α-cyanoacrylate to NCS$^-$ constitutes chemical amplification and accounts for the high photosensitivity of this system.

4) The inorganic metal complex should be soluble in the pure substrate or in a solvent that also dissolves the substrate. Solubility of the complex in nonaqueous solutions is necessary to enable formulation with a range of organic substrates such as epoxides and acrylates. A typical photoresist formulation used for photolithography consists of an organic substrate, a photoinitiator, and a casting solvent. This formulation is spin-coated onto a silicon wafer to form a thin film and the solvent is then removed by heating. Common casting solvents include 2-butanone, cyclohexanone, and propylene glycol methyl ether acetate. For polymerization reactions, solubility of the inorganic photoinitiator in the monomer obviates the need for a solvent.

5) The inorganic metal complex should be thermally stable for a reasonable length of time, to provide a suitable shelf life. For many applications, a shelf life of 3–6 months at room temperature is desirable. Transition metal complexes in which the central metal possesses a d$^3$, low-spin d$^6$, or low-spin d$^8$ electronic configuration are especially resistant to thermal release of ligands. Other examples of thermally stable complexes include those with metals in high formal oxidation states such as Mo(CN)$_8^{4-}$. Shelf life is improved by minimizing the exposure of the complex to heat or light. Photopolymerizable solutions of trans-Cr(NH$_3$)$_2$(NCS)$_4^-$ in ethyl α-cyanoacrylate remain usable for up to one month when stored in the dark at room temperature.

One approach for retarding the thermal substitution reactions of coordination complexes involves tethering the central metal with a macrocyclic ligand. For example, trans-Cr(cyclam)Cl$_2^+$ (cyclam is 1,4,8,11-tetraazacyclotetradecane) undergoes thermal release of Cl$^-$~10$^3$ times more slowly than trans-Cr(en)$_2$Cl$_2^+$. While the quantum yield for photo-induced Cl$^-$ loss experiences a comparable reduction, this factor is easily compensated by employing a more intense light source (e.g. a laser rather than a conventional arc lamp).

B. Examples of Anionic Photoinitiators

Reineckate's Anion

Reineckate's anion, trans-[Cr(NH$_3$)$_2$(NCS)$_4$]$^-$, is a preferred transition metal complex for anionic photoinitiation. The anion dissolves readily in a variety of nonaqueous solvents, resists thermal substitution in nonhydroxylic media, and undergoes quantum efficient release of the nucleophile NCS$^-$ upon ligand-field excitation with near-ultraviolet/visible light at greater than 350 nm. Photochemical release of NH$_3$ or radicals from the Reineckate anion only occurs at much shorter wavelengths.

The photogenerated thiocyanate anion will attack an electron deficient carbon to create a new anionic reactive center.

Trans-Cr(en)$_2$(NCS)$_2^+$

Trans-Cr(en)$_2$(NCS)$_2^+$, a cationic analogue of Reineckate's salt, undergoes photochemical release of NCS$^-$ under green light, and therefore can function as a photoinitiator for anionic polymerization. The complex is soluble in acetonitrile and acetone.

Example 2 Anionic Polymerization of Ethyl α-Cyanoacrylate with Trans-Cr(en)$_2$(NCS)$_2^+$ A solution containing 95% by volume of ethyl α-cyanoacrylate, 5% by volume of acetonitrile, and 1.1×10$^{-3}$M trans-[Cr(en)$_2$(NCS)$_2$]PF$_6$ was exposed to 532-nm light from a Nd-YAG laser at an intensity of 2.9×10$^{-6}$ einsteins/s. A solid plug of polymer formed in the path of the light beam after irradiation for 90 s.

Trans-Cr(en)$_2$Cl$_2^+$

Trans-[Cr(en)$_2$Cl$_2$]Cl can be prepared by the method described by G. Brauer in *Handbook of Preparative Inorganic Chemistry*, 2nd Ed., vol. 2, Academic Press: New York, 1965, p. 1357–1358. Simple metathesis with NH$_4$PF$_6$ converts the complex to its PF$_6^-$ salt. Irradiation into the first spin-allowed ligand field absorption band of trans-Cr(en)$_2$Cl$_2^+$ is known to cause release of Cl$^-$ with a quantum efficiency of 0.32 in aqueous solution (see *Canadian Journal of Chemistry*, vol. 48, 1524, 1971). It has been discovered that Cl$^-$ is an effective initiator for the anionic polymerization of ethyl α-cyanoacrylate. Thus as little as 1.3×10$^{-4}$M Cl$^-$ causes 0.5 mL of ethyl α-cyanoacrylate to polymerize in less than 1 second. A 532-nm irradiation of a solution containing 95% by volume of ethyl α-cyanoacrylate, 5% by volume of acetonitrile as co-solvent, and 2.0×10$^{-3}$M trans-[Cr(en)$_2$Cl$_2$]PF$_6$ can be used to induce photoinitiated anionic polymerization of the acrylate monomer.

Pt(acac)$_2$

It has been discovered that Pt(acac)$_2$ at concentrations as low as 105 ppm and wavelengths slightly less than 300 nm to greater than 300 nm are effective in initiating anionic polymerization reactions. The photolysis time required for polymerization depends upon several variables, including Pt(acac)$_2$ concentration, light intensity and excitation wavelength.

The electronic structure and spectroscopy of Pt(acac)$_2$ has been described in *Inorg. Chem.*, 1993, 32, 1251–1258. It appears that irradiation of Pt(acac)$_2$ initially excites a ligand-localized π-π* transition rather than a ligand field or ligand-to metal charge transfer transition. The complex releases an anionic polymerization initiating species on irradiation, that is probably acac-.

For example, photolysis (λ>300 nm) of a 1.07×10$^{-4}$M (42 ppm) Pt(acac)$_2$ methanolic solution for six minutes resulted in the loss of discernible bands due to Pt(acac)$_2$ and the formation of a single intense absorption centered at 272 nm. The ultraviolet\visible spectra of the material also indicated the formation of colloidal platinum. The shape and position of the absorption band at 272 nm, that was formed as a result of photolysis, are consistent with the UV/Vis spectrum of an authentic sample of 2,4-pentanedione in methanol. This indicates that the species responsible for initiating polymerization is the photo-liberated acetylacetonate anion.

Example 3 Anionic Polymerization of Ethyl α-Cyanoacrylate with Pt(acac)$_2$

A solution containing 95% by volume of 2-cyanoethylacrylate, 5% by volume of acetonitrile, and varying concentrations Pt(acac)$_2$ ("PA") was exposed to light from a 200-watt high pressure mercury lamp. The time for polymerization of the 2-cyanoethylacrylate for the various concentrations of photoinitiator is shown in Table 1 below.

TABLE 1

| Amount of PA (M/ppm) | Excitation wavelength[a] | time for polymerization |
|---|---|---|
| 3.81 × 10$^{-3}$/1500 | >300 nm | 21.9 sec. |
| 1.27 × 10$^{-3}$/500 | >300 nm | 25.7 sec. |
| 1.14 × 10$^{-3}$/448 | >300 nm | 17.3 sec. |
| 8.52 × 10$^{-4}$/335 | >300 nm | 20.6 sec. |
| 7.25 × 10$^{-4}$/285 | >300 nm | 27.2 sec. |
| 2.67 × 10$^{-4}$/105 | >300 nm | 67.2 sec. |
| 2.67 × 10$^{-4}$/105 | 365 nm | 211.1 sec. |

[a]The output from a 200-watt high-pressure mercury lamp was passed through Pyrex to obtain λ > 300 nm or through a narrow bandpass interference filter to isolate 365 nm light.

The anionic mechanism of these polymerizations was confirmed by carrying out the reaction with a known free radical scavenger, hydroquinone, and a known anion scavenger, methyl sulfonic acid. The photolysis time required to initiate 2-cyanoethylacrylate polymerization was unchanged in the presence of a large excess of hydroquinone. In contrast, polymerization was inhibited in samples when the concentration of an anion scavenger, methyl sulfonic acid, was increased to 100 ppm or greater.

TABLE 2

| Amount of PA (M/ppm) | Excitation[a] wavelength | Inhibitor[b] Concentration (M/ppm) | time for polymerization |
|---|---|---|---|
| 1.79 × 10$^{-3}$/704 | >300 nm | 0 | 14.5 sec. |
| 1.79 × 10$^{-3}$/704 | >300 nm | 4.28 × 10$^{-4}$/41[c] | 55.8 sec. |
| 8.52 × 10$^{-4}$/335 | >300 nm | 0 | 20.6 sec. |
| 8.52 × 10$^{-4}$/335 | >300 nm | 4.28 × 10$^{-3}$/411[c] | >600 sec. |
| 1.14 × 10$^{-3}$/448 | >300 nm | 0 | 17.3 sec. |
| 1.14 × 10$^{-3}$/448 | >300 nm | 4.28 × 10$^{-3}$/411[c] | >600 sec. |
| 7.25 × 10$^{-4}$/285 | >300 nm | 0 | 27.2 sec. |
| 7.25 × 10$^{-4}$/285 | >300 nm | 1.56 × 10$^{-2}$/1498[c] | >600 sec. |
| 3.81 × 10$^{-3}$/1500 | >300 nm | 0 | 21.9 sec. |
| 3.81 × 10$^{-3}$/1500 | >300 nm | 3.18 × 10$^{-2}$/3500[d] | 23.2 sec. |

[a]The output from a 200-watt high-pressure mercury lamp was passed through Pyrex to obtain λ > 300 nm or through a narrow bandpass interference filter to isolate 365 nm light.
[b]Concentrations do not take into account the inhibitor concentrations that are already present in 2-cyanoethylacrylate. 2-cyanoethylacrylate, as received, contains 5 ppm of the anion inhibitor methyl sulfonic acid and 1000 ppm of the free-radical scavenger hydroquinone.
[c]Concentration of methyl sulfonic acid.
[d]Concentration of hydroquinone.

As with the other anionic photoinitiators described herein, samples of 2-cyanoethylacrylate containing Pt(acac)$_2$ were stable in the dark. For this system, no apparent decomposition or polymerization occurred after 6 days. When the methylsulfonic acid concentration in 2-cyanoethylacrylate samples containing Pt(acac)$_2$ was raised from 5 ppm to 40 ppm, samples were stable in the dark for at least 40 days without significant decrease in photosensitivity.

Cyclopentadienyl Metallo Complexes

It has also been discovered that iron and ruthenium cyclopentadienyl complexes can act as polymerization initiating species for anionic polymerization. The cyclopentadientyl groups can be unsubstituted, or one or both of the cyclopentadienyl groups can be independently substituted with one, two, or more substituents of the formula —C(O)R, wherein R is a C$_1$ to C$_{10}$ aliphatic group (alkyl, alkenyl, or alkynyl) or aryl. Typical wavelengths for photoinitiation using these complexes range from 290 to 500 nm. The optimal wavelength of irradiation for each complex can be determined by simple inspection of the ultraviolet/visible spectrum for the complex.

Figure 1:
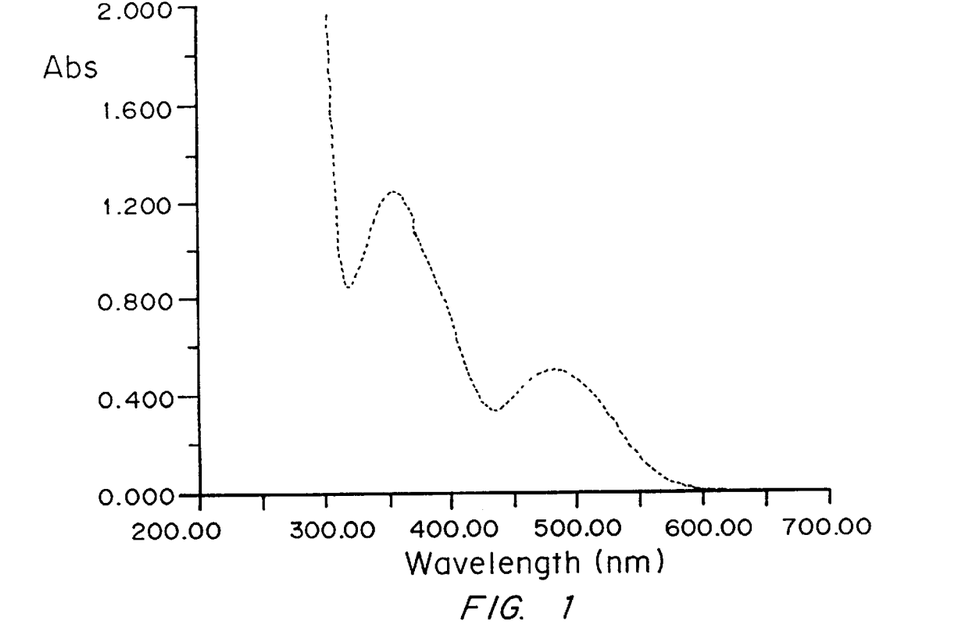
FIG. 1 is a graph of the UV-visible spectrum of ($\eta^5$—$C_5H_4COC_6H_5)_2Fe$ ($2.92\times10^{-4}$ M or 115 ppm, extinction coefficient 365=3,976) in acetonitrile.
Figure 2:
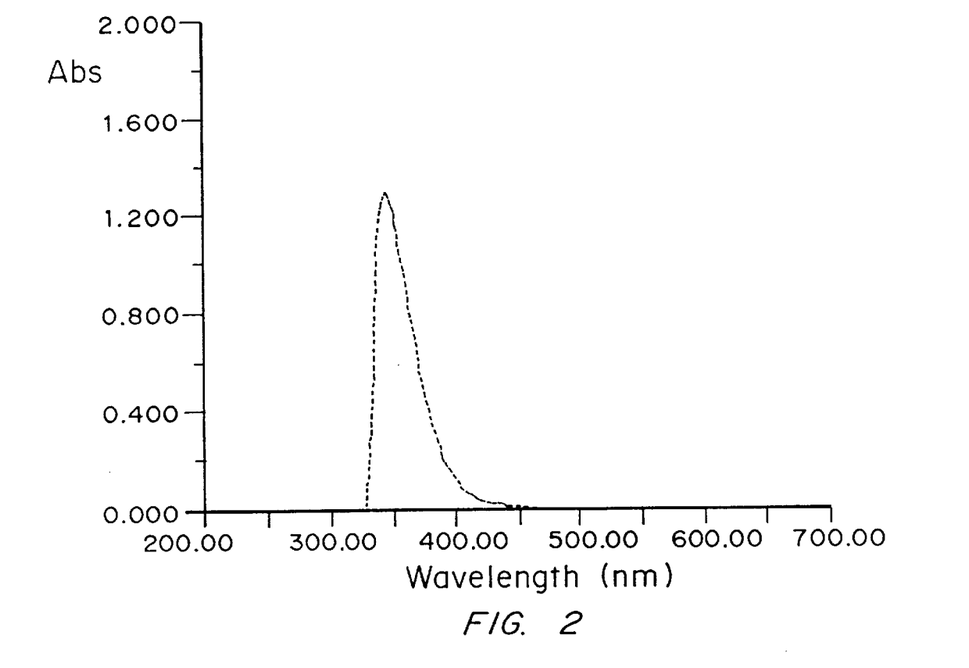
FIG. 2 is a graph of the UV-visible spectrum of ($\eta^5$—$C_5H_5)_2Ru$ ($2.77\times10^{-3}$ M), extinction coefficient 365=264 $M^{-1} cm^{-1}$).

The photochemistry of complexes such as (η$^5$—C$_5$H$_5$)(η$^5$—C$_5$H$_4$COR)Fe (where R=C$_6$H$_5$, H, CH$_3$) and (η$^5$—C$_5$H$_4$COR)$_2$Fe (where R=C$_6$H$_5$) has been relatively well studied. Photolysis of these complexes, in solvents which contain trace impurities of water, results in the formation of (π—C$_5$H$_5$Fe(solv)$_n$$^+$PhCO$_2$$^-$+C$_5$H$_4$$^-$+(η$^5$—C$_5$H$_5$)$_2$Fe (as a minor product). Either anionic species is capable of initiating anionic polymerization. FIG. 1 is a graph of the UV-visible spectrum of (η$^5$—C$_5$H$_4$COC$_6$H$_5$)$_2$Fe (2.92×10$^-$$_4$M or 115 ppm, extinction coefficient 365=3,976) in acetonitrile. FIG. 2 is a graph of the UV-visible spectrum of (η$^5$—C$_5$H$_5$)$_2$Ru (2.77×10$^{-3}$M), extinction coefficient 365= 264M$^{-1}$ cm$^{-1}$).

It is generally accepted that the photolysis of ruthenocene, in relatively polar solvents, results in oxidation leading to the formation of the ruthenicenium ion and solvated electrons. The species responsible for initiating the anionic polymerization of 2-cyanoethylacrylate may be a photoejected solvated electron. Solvated electrons are capable of initiating anionic polymerization reactions.

Example 4 Anionic Polymerization of Ethyl α-Cyanoacrylate with $(\eta^5-C_5H_5)_2Ru$ Solutions containing 95% by volume of ethyl α-cyanoacrylate, 5% by volume of acetonitrile, and varying concentrations of $(\eta^5-C_5H_5)_2Ru$ were exposed to light having a wavelength of greater than 300 nm from a 200-watt high pressure mercury lamp passed through Pyrex. The time for polymerization of the 2-cyanoethylacrylate for the various concentrations is shown in Table 3 below.

TABLE 3

| Amount of Photoinitiator (M/ppm) | Excitation wavelength[a] | Time for polymerization |
| --- | --- | --- |
| $1.01 \times 10^{-2}/2337$ | >300 nm | 11.3 sec. |
| $5.06 \times 10^{-3}/1170$ | >300 nm | 10.9 sec. |
| $2.42 \times 10^{-3}/560$ | >300 nm | 16.6 sec. |
| $9.30 \times 10^{-4}/1215$ | >300 nm | 20.6 sec. |

[a]The output from a 200-watt high-pressure mercury lamp was passed through Pyrex to obtain λ > 300 nm.

The anionic mechanism of the reaction was confirmed by conducting polymerizations in the presence of a known radical scavenger, hydroquinone, or a known anion scavenger, methylsulfonic acid. The photolysis time required to initiate 2-cyanoethylacrylate polymerization was relatively unaffected by the presence of a large excess of hydroquinone. In contrast, polymerization was completely inhibited in samples where the concentration of the anion scavenger, methyl sulfonic acid, had been increased to 296 ppm or greater.

TABLE 4

Anionic and Free-Radical Inhibition Studies

| Amount of Photoinitiator (M/ppm) | Excitation[a] wavelength | Inhibitor[b] Concentration (M/ppm) | time for polymerization |
| --- | --- | --- | --- |
| $1.01 \times 10^{-2}/2337$ | >300 nm | 0 | 11.3 sec. |
| $1.01 \times 10^{-2}/2337$ | >300 nm | ≈$5.14 \times 10^{-1}/49,367^c$ | >600 sec. |
| $2.42 \times 10^{-3}/560$ | >300 nm | 0 | 16.6 sec. |
| $2.42 \times 10^{-3}/560$ | >300 nm | $5.14 \times 10^{-3}/494^c$ | >600 sec. |
| $2.42 \times 10^{-3}/560$ | >300 nm | $3.63 \times 10^{-3}/400^d$ | 18.7 sec. |
| $9.30 \times 10^{-4}/215$ | >300 nm | 0 | 20.6 sec. |
| $9.30 \times 10^{-4}/215$ | >300 nm | $3.08 \times 10^{-3}/296^c$ | >600 sec |
| $9.30 \times 10^{-4}/215$ | >300 nm | $1.56 \times 10^{-2}/2000^d$ | 48.0 sec. |
| $9.30 \times 10^{-4}/215$ | >300 nm | $3.63 \times 10^{-2}/4000^d$ | 75.9 sec. |

TABLE 4-continued

Anionic and Free-Radical Inhibition Studies

| Amount of Photoinitiator (M/ppm) | Excitation[a] wavelength | Inhibitor[b] Concentration (M/ppm) | time for polymerization |
| --- | --- | --- | --- |

[a]The output from a 200-watt high-pressure mercury lamp was passed through Pyrex to obtain λ > 300 nm.
[b]Concentrations do not take into account the inhibitor concentrations that are already present in 2-cyanoethylacrylate. Ca, as received, contains 5 ppm of the anion inhibitor methyl sulfonic acid and 1000 ppm of the free-radical scavenger hydroquinone.
[c]Concentration of methyl sulfonic acid.
[d]Concentration of hydroquinone.

Samples of 2-cyanoethylacrylate containing $(\eta^5-C_5H_5)_2Ru$ were stable in the dark with no apparent decomposition or polymerization occurring for as long as 14 days.

Example 5—Anionic Polymerization of Ethyl α-Cyanoacrylate with $(\eta^5-C_5H_5)(\eta^5-C_5H_4COR)Fe$ (where $R=C_6H_5$, H, or $CH_3$) or $(\eta^5-C_5H_4COR)_2Fe$ (where $R=C_6H_5$)

Solutions containing 95% by volume of ethyl α-cyanoacrylate, 5% by volume of acetonitrile, and varying concentrations of $(\eta^5-C_5H_5)(\eta^5-C_5H_4COR)Fe$ were exposed to light having a wavelength of λ>320 nm. The time for polymerization of the 2-cyanoethylacrylate for the concentrations is shown in Table 5 below.

TABLE 5

| Photoinitiator | | Photoinitiator | Excitation | |
| --- | --- | --- | --- | --- |
| $(\eta^5-C_5H_4R')$ R' | $(\eta^5-C_5H_4COR)Fe$ R | concentration (M/ppm) | Wavelength (nm) | Time for polymerization[a] |
| $COC_6H_5$ | $C_6H_5$ | $5.84 \times 10^{-4}/230$ | >320 | 4.6 sec. |
| H | H | $1.57 \times 10^{-3}/335$ | >320 | 508 sec. |
| H | $CH_3$ | $2.19 \times 10^{-3}/500$ | >320 | 421 sec. |
| H | $C_6H_5$ | $2.36 \times 10^{-3}/685$ | >320 | 196 sec. |

[a]It should be noted that 2-cyanoethylacrylate, as received, contains 5 ppm of the anion inhibitor methyl sulfonic acid and 1000 ppm of the free-radical scavenger, hydroquinone.

The anionic mechanism of the polymerization process was again confirmed by carrying out the reaction in the presence of the radical scavenger hydroquinone, and the anion scavenger methyl sulfonic acid. The photolysis time required to initiate 2-cyanoethylacrylate polymerization was unchanged in the presence of a large excess of hydroquinone. In contrast, polymerization was inhibited in samples where the concentration of the anion scavenger, methyl sulfonic acid, had been increased to 494 ppm or greater.

As with the other photoiniatiors, samples of 2-cyanoethylacrylate containing $(\eta^5-C_5H_5)(\eta^5-C_5H_4COR)Fe$ (where $R=C_6H_5$, H, $CH_3$) or $(\eta^5-C_5H_4COR)_2Fe$ (where $R=C_6H_5$) are stable in the dark with no apparent decomposition or polymerization occurring for as long as 14 days. In particular, a 2-cyanoethylacrylate sample containing 685 ppm of $(\eta^5-C_5H_5)(\eta^5-C_5H_4COR)Fe$ (where $R=C_6H_5$) was stable, in the dark for 20 days.

TABLE 6

| Photoinitiator | | Photoinitiator | Inhibitor | |
|---|---|---|---|---|
| $(\eta^5\text{-}C_5H_4R')$ R' | $(\eta^5\text{-}C_5H_4COR)Fe$ R | concentration (M/ppm) | concentration (M/ppm) | Time for polymerization[a] |
| $COC_6H_5$ | $C_6H_5$ | $5.84 \times 10^{-4}/230$ | $5.14 \times 10^{-3}/494$[b] | |
| $COC_6H_5$ | $C_6H_5$ | $5.84 \times 10^{-4}/230$ | $3.94 \times 10^{-3}/4333$[c] | |
| H | H | $1.57 \times 10^{-3}/335$ | $5.14 \times 10^{-3}/494$[b] | |
| H | H | $1.57 \times 10^{-3}/335$ | $2.73 \times 10^{-3}3000$[c] | |
| H | $CH_3$ | $2.19 \times 10^{-3}/500$ | $5.14 \times 10^{-3}494$[b] | |
| H | $CH_3$ | $2.19 \times 10^{-3}/500$ | $2.73 \times 10^{-3}3000$[c] | |
| H | $C_6H_5$ | $2.36 \times 10^{-3}/685$ | $5.14 \times 10^{-3}494$[b] | |
| H | $C_6H_5$ | $2.36 \times 10^{-3}/685$ | $2.73 \times 10^{-3}3000$[c] | |

[a] The light source was a 200-Watt high-pressure mercury lamp, passed through pyrex to obtain $\lambda > 320$ nm.
[b] Concentration of the anion inhibitor, methyl sulfonic acid.
[c] Concentration of the free-radical scavenger, hydroquinone.

II. Examples of Substrates that can be Treated with the Anionic Photoinitiator Monomers, oligomers, and polymers that can be modified by anionic photoinitiation are those that are capable of reaction on attack by an anionically charged nucleophile, including but not limited to ethylene, 1,3-dienes, styrene and α-methyl styrene, acrylates and methacrylates, acrylonitrile, methacrylonitrile, acrylamide and methacrylamide, and aldehydes and ketones, and oligomers and polymers containing these moieties. Suitable substrates also include monomers, oligomers, and polymers that undergo anionic ring-opening polymerization or crosslinking reactions, for example, N-carboxy-α-amino anhydrides, cyclic amides, cyclic esters, epoxides and siloxanes.

Preferred monomers are ethylenically unsaturated monomers that contains electron-withdrawing substituents to stabilize the negative charge, for example, ethyl α-cyanoacrylate (see equation 5) and methyl α-trifluoromethylacrylate.

$$NCS^- + H_2C=C(CN)(CO_2C_2H_5) \rightarrow H_2(NCS)C\text{—}C(CN)(CO_2C_2H_5)$$
$$(-) \rightarrow polymer$$

In general, an anionic photoinitiator is selected that will react with the substrate to be modified or polymerized. The more nucleophilic the anion released from the excited metal complex, the less electrophilic the substrate is required to be. For example, ethyl α-cyanoacrylate is quite reactive because the electron-withdrawing effect of the cyano group causes the β-carbon to be highly electrophilic. Almost any anion will initiate polymerization of this monomer, including thiocyanate, bromide, and azide ion. Methyl α-trifluoromethylacrylate is also quite reactive because the α-trifluoromethyl group has a strong inductive effect. In contrast, ethylene does not contain an electron withdrawing group and thus polymerization of this monomer must be initiated by a strong nucleophile, such as n-butyl carbanion. N-carboxy-α-amino anhydrides, cyclic amides, cyclic esters, epoxides and siloxanes can be initiated with alkoxide or hydroxide ion.

Numerous polymer textbooks describe in detail whether monomers are active toward anionic, cationic, or radical polymerization, or a mixture thereof, and therefore this type information is known, or can be easily determined without undue experimentation using standard assays by one skilled in the art. One of the goals of this invention is to avoid free radical polymerization, because it is sensitive to atmospheric oxygen.

III. Anionic Photoinitiation Process

The photoinitiator can be dissolved in neat monomer (e.g. Reineckate's salt in ethyl α-cyanoacrylate) or in a solution of substrate and a co-solvent (e.g. trans-$Cr(en)_2(NCS)_2^+$ in 95% ethyl α-cyanoacrylate and 5% acetonitrile).

The anionic process can be carried out by either dissolving the photoinitiator in neat monomer or in a solution of substrate and a co-solvent. If a co-solvent is employed, it should not undergo proton transfer equilibria, since this will provide a pathway for scavenging anion species active in initiating and propagating polymerization. Water and aqueous acids are classic examples of solvents that undergo proton transfer equilibria. Water has an especially negative effect on anionic polymerization, since it is an active chain transfer agent. Examples of preferred solvents are diethyl ether, tetrahydrofuran, and acetonitrile. It is typically desired, but not required, that the complex have a solubility of at least $1 \times 10^{-4}$M in the cosolvent.

The anionic photoinitiation reaction can be carried out at any temperature that provides the desired results. A temperature of between 20°–30° C. is suitable in many cases, since higher temperatures favor thermal release of anions and lower temperatures may cause solubility problems.

Any amount of photoinitiator can be used that suitably initiates the desired reaction. An amount of photoinitiator in the formulation ranging from parts per million to part per hundred is typically suitable depending upon the system and desired applications.

Anionic photoinitiation is retarded in the presence of acids that neutralize the anion, or nucleophile. Certain unsaturated monomers used in chain polymerization reactions contain compounds that act as radical or basic scavengers, that are in fact acids and that can interfere with the anionic polymerization reaction.

On initiation of an anionic polymerization process, a large number of monomer anions are formed that react with other monomers to form polymers. If a small number of acidic groups are present in the polymerizing solution, for example, in the form of a stabilizer or comonomer, those acidic groups will quench an equivalent number of propagating monomer anions. The remaining anions will continue to react with other monomers to form polymers. Based on the amount of acidic groups present, the anionic reaction will either be retarded or quenched completely. When a solvent is used that contains an active hydrogen, such as water or acid, since the solvent is almost always present in a molar quantity that exceeds, and usually greatly exceeds, the molar quantity of the anions in solution, the anionic polymerization reaction cannot occur because all anions formed are immediately quenched.

The material with the anionic photoinitiator should be maintained in the absence of radiation of the wavelength that will initiate reaction, until reaction is desired.

The method is described below for convenience with reference to the reaction of ethyl α-cyanoacrylate with Reineckate's anion. However, it should be understood that the present invention is not limited to these examples but includes all of the embodiments described above.

Example 6 Anionic Photoinitiation of α-Cyanoacrylate by Reineckate's Anion

Neat ethyl α-cyanoacrylate (99.88% purity from Loctite Corporation) is a colorless liquid with a viscosity of 2.8 cP at 22° C. The sample employed in this study contained scavengers for adventitious radical and basic impurities. Commercially available ammonium salt of Reineckate's anion (Alfa) was converted to the potassium salt ($K^+R^-$). Solutions of ethyl α-cyanoacrylate containing $K^+R^-$ (0.19–2.7×10$^{-3}$M) undergo no change in viscosity when kept in the dark for one week at room temperature. In contrast, mixing one drop of a 5.2×10$^{-3}$M solution of $K^+NCS^-$ in acetonitrile with 0.5 mL of ethyl α-cyanoacrylate causes immediate (<1 s) solidification accompanied by considerable evolution of heat. This dramatic response establishes $NCS^-$ as an effective initiator for the polymerization of ethyl α-cyanoacrylate.

The electronic absorption spectrum of $K^+R^-$ dissolved in ethyl α-cyanoacrylate exhibits bands at 400 nm ($\epsilon$=89M$^{-1}$cm$^{-1}$) and 528 nm ($\epsilon$=114M$^{-1}$cm$^{-1}$) arising from spin-allowed ligand field transitions. Selective excitation (532 or 546 nm) of the lower-energy transition causes the solution to thicken and eventually solidify. This behavior is the direct consequence of the photochemical release of $NCS^-$ which, as noted above, functions as an effective initiator for polymerization. The key role played by anionic species is underscored by the observation that increased levels of base scavenger (a protonic acid) in the monomer sample inhibits polymerization. This effect is attributed to the ability of the protonic acid to scavenge photogenerated $NCS^-$ and/or anionic sites on the growing polymer chain.

Example 7 The Effect of Concentration of Anionic Photoinitiator and Incident Light Intensity on Rate of Polymerization Ethyl α-cyanoacrylate (2 mL) containing various concentrations of $K^+R^-$ were irradiated (with stirring in runs a–c) in a 1-cm rectangular Pyrex cell, as described in Table 7. No attempt was made to exclude air from the sample. The dependence of photoinitiated polymerization on the $K^+R^-$ concentration and the incident light intensity is provided in Table 7. At constant intensity, polymerization proceeds more rapidly at higher complex concentration (compare runs a and c). Such behavior reflects the greater fraction of light absorbed by the more concentrated sample and the correspondingly higher photochemical rate of $NCS^-$ release. An analogous explanation accounts for the faster polymerization observed upon increasing light intensity at constant $K^+R^-$ concentration (compare runs a and b).

TABLE 7

Effects of $K^+R^-$ Concentration and Light Intensity Upon the Rate of Photoinitiated Polymerization of Ethyl α-Cyanoacrylate

| polymerization run | [$K^+R^-$], M | $\lambda_{ex}$, nm | I, einsteins/s[a] | time, s[b] |
|---|---|---|---|---|
| a | 2.1 × 10$^{-3}$ | 546 | 3.97 × 10$^{-8}$ | 880 |
| b | 2.1 × 10$^{-3}$ | 546 | 2.08 × 10$^{-8}$ | 1540 |
| c | 5.1 × 10$^{-4}$ | 546 | 3.97 × 10$^{-8}$ | 3380 |
| d | 2.0 × 10$^{-3}$ | 532 | 2.13 × 10$^{-6}$ | 6 |
| e | 6.0 × 10$^{-4}$ | 532 | 2.13 × 10$^{-6}$ | 12 |
| f | 2.0 × 10$^{-4}$ | 532 | 2.13 × 10$^{-6}$ | 45 |

[a]Incident light intensity. Light at 546 nm was obtained by passing the output of a 200-W high-pressure mercury lamp through a narrow bandpass interference filter, while a Nd-YAG pulsed laser operated at 10 Hz was used for irradiations at 532 nm.
[b]Time required for sample to become so viscous that stirring bar ceased to spin (runs a–c), or time required for the formation of a solid plug of polymer along the path of the 7-mm diameter laser beam (runs d–f).

Example 8 Effect of a Free Radical Trap, Hydroquinone, on the Photoinitiated Anionic polymerization of Ethyl cyanoacrylate using Reineckate's anion $KCr(NH_3)_2(NCS)_4$ (0.0092 grams) was weighed out and dissolved in 10 mls of ethyl α-cyanoacrylate yielding a solution that was 2.573×10$^{-3}$M (920 ppm) $KCr(NH_3)_2(NCS)_4$. This solution was allowed to stir for 60 minutes, in the dark, prior to any photolysis experiments. Subsequently, 3 mls of the solution was transferred to a Pyrex test tube equipped with a stir bar. The sample was then photolyzed with the 546 nm filtered output from a 200 W high pressure mercury lamp. The sample polymerized after 446 seconds of irradiation.

An additional 3 ml sample of the stock solution was transferred to a Pyrex test tube similarly equipped with a stir bar. However, to this sample was added 7 mg of the well-known free radical trap, hydroquinone. That now made this sample 2.573×10$^{-3}$M or 920 ppm in $KCr(NH_3)_2(NCS)_4$ and 2.12×10$^{-2}$M or 2,333 ppm in hydroquinone. The 2,333 ppm hydroquinone concentration does not take into account the 1000 ppm of hydroquinone present in ethyl α-cyanoacrylate as purchased. This sample was then allowed to stir for 40 minutes prior to photolysis. This sample was then photolyzed with the identical set up as the previous sample. The ethyl α-cyanoacrylate polymerized after 388 seconds of irradiation. The hydroquinone clearly had no detrimental effects on the polymerization.

Example 9 Effect of a Free Radical Scavenger, Oxygen, on the Photoinitiated Anionic polymerization of Ethyl α-cyanoacrylate using Reineckate's anion $KCr(NH_3)_2(NCS)_4$ (0.0082 g) was weighed out and dissolved in 10 mls of ethyl α-cyanoacrylate yielding a solution that was 2.294×10$^{-3}$M or 820 ppm in $KCr(NH_3)_2(NCS)_4$. This solution was allowed to stir for 60 minutes prior to any photolysis experiments.

After stirring for 60 minutes, 3 mls of the stock solution was transferred to a Pyrex test tube equipped with a stir bar. This first sample was not bubbled with any gas and no effort was made to exclude oxygen from the system. The sample was then photolyzed with the 546 nm filtered output from a 200 W high pressure mercury lamp. After 358 seconds of irradiation, the ethyl α-cyanoacrylate had polymerized.

A second 3 ml sample of the initial solution was transferred to a new Pyrex test tube and a stir bar was added. The test tube was then capped with a rubber septum. Two needles were then forced through the rubber septum. One long needle was for bubbling the solution with oxygen and one short needle was for venting the excess gas. The solution was bubbled for ten minutes and then the short needle was removed first and then the long needle, leaving a static atmosphere of oxygen in the test tube. This sample was then photolyzed using the identical set up just described. The ethyl α-cyanoacrylate polymerized after 398 seconds of irradiation.

A third sample was prepared with 3 mls of the initial solution and a stir bar. The rubber septum was again placed on the test tube and the two needles were inserted. However, in this case, the bubbling gas was 99.999% pure Argon. The sample was bubbled for 10 minutes and then the needles were removed. This sample was then photolyzed, with the identical set up previously described. The ethyl α-cyanoacrylate polymerized after 321 seconds of irradiation.

Within our experimental error, the percent of free radical scavenging oxygen present had no effect on the rate of polymerizing ethyl α-cyanoacrylate. The results of the two sets of experiments just described are clearly not consistent with a free radical process being responsible for the polymerization.

Example 10 Kinetic Characterization of Anionic Photoinitiation

A more detailed kinetic characterization of the photoinitiated polymerization process of ethyl α-cyanoacrylate using Reineckate's anion was obtained by real-time Fourier-transform infrared spectroscopy. This relatively new technique allows continuous monitoring (up to 204 infrared spectra collected per minute) of the sample during irradiation. The extent of polymerization is directly related to the decrease in absorbance of the C=C stretching band of ethyl α-cyanoacrylate at 1616 cm$^{-1}$. This relationship is expressed in eq. 6, where $A_0$ denotes the initial (dark) area of the band and $A_t$ the area after t $$\% \text{ polymerization} = \frac{(A_0 - A_t)}{A_0} \times 100 \quad (6)$$

seconds of irradiation.

FIG. 3 is a plot of percentage polymerization vs. time of irradiation for samples of ethyl α-cyanoacrylate containing the following concentrations of Reineckate's anion: (□) 0M; (*) 2.2×10$^{-4}$M; (+) 5.4×10$^{-4}$M; (■) 2.0×10$^{-3}$M. Samples were coated onto acid-treated silicon wafers and irradiated with 500 mW/cm$^2$ of polychromatic (300–630 nm) light.

The data shown in FIG. 1 agree with earlier observations (Table 7) that polymerization occurs more rapidly in samples containing higher K$^+$R$^-$ concentrations. The rate of photoihitiated polymerization, R$_p$, can be calculated from eq. 7, where $A_{t1}$ and $A_{t2}$ represent the areas under the 1616 cm$^{-1}$ band at irradiation times t1 and t2, and M is the molar concentration of vinyl groups in ethyl α-cyanoacrylate. Maximum rates of 3.0, 1.3, and 0.60M•s$^{-1}$ result for ethyl α-cyanoacrylate samples containing 2.0×10$^{-3}$, 5.4×10$^{-4}$, and 2.2×10$^{-4}$M concentrations of K$^+$R$^-$, respectively.

$$R_p = \frac{M(A_{t1} - A_{t2})}{A_0(t2 - t1)} \quad (7)$$

This data demonstrates that visible-light irradiation of trans-[Cr(NH$_3$)$_2$(NCS)$_4$]$^-$ dissolved in ethyl α-cyanoacrylate initiates anionic polymerization. The initiation step involves addition of photoreleased NCS$^-$ to the carbon-carbon double bond of the acrylate monomer.

This invention has been described with reference to its preferred embodiments. Variations and modifications of the invention, method for anionic polymerization, will be obvious to those skilled in the art from the foregoing detailed description of the invention. It is intended that all of these variations and modifications be included within the scope of the appended claims.

We claim:

1. A method for anionically polymerizing or crosslinking a compound, monomer, oligomer, or polymer, comprising the step of irradiating a mixture of a compound, monomer, oligomer, or polymer and an inorganic transition metal complex selected from the group consisting of optionally substituted ferrocene complexes comprising at least one Fe atom complexed with two or more cyclopentadienyl moieties, wherein one or more of the cyclopentadienyl groups in the complex may be optionally substituted with at least one substituent of the formula —C(O)R, wherein R is a $C_1$ to $C_{10}$ aliphatic group selected from the group consisting of alkyl, alkenyl, or alkynyl, or is aryl, under irradiation conditions sufficient for the inorganic transition metal complex to photochemically react to release a polymerization initiating substance consisting essentially of an anionically charged nucleophile capable of initiating a polymerization or crosslinking reaction of the compound, monomer, oligomer, or polymer.

2. The method of claim 1 wherein the compound, monomer, oligomer, or polymer is selected from the group consisting of ethylene, 1,3-diene, styrene, α-methyl styrene, acrylate ester, methacrylate ester, acrylonitrile, methacrylonitrile, acrylamide, methacrylamide, aldehydes capable of undergoing anionic polymerization or crosslinking, and ketones capable of undergoing anionic polymerization or crosslinking.

3. The method of claim 1, wherein the compound, monomer, oligomer or polymer is selected from the group consisting of N-carboxy-α-amino anhydrides, cyclic amides, cyclic esters, epoxides, and siloxanes capable of undergoing anionic ring opening polymerization or crosslinking reactions.

4. The method of claim 1, wherein the inorganic transition metal complex is selected from the group consisting of ($\eta^5$—C$_5$H$_5$) ($\eta^5$—C$_5$H$_5$COR)Fe and ($\eta^5$—C$_5$H$_5$COR)$_2$Fe wherein R is selected from the group consisting of H, phenyl, and alkyl.

5. The method of claim 4, wherein the compound, monomer, oligomer, or polymer is 2-cyanoethylacrylate.

6. The method according to claim 4, wherein the inorganic transition metal complex comprises ($\eta^5$—C$_5$H$_5$)($\eta^5$—C$_5$H$_4$COR)Fe, wherein R is phenyl.

7. The method according to claim 4, wherein the inorganic transition metal complex comprises ($\eta^5$—C$_5$H$_4$COR)$_2$Fe, wherein R is phenyl.

8. The method of claim 1, wherein the irradiating comprises exposing to near-ultraviolet or visible light.

9. The method of claim 1, wherein the compound, monomer, oligomer, or polymer is a polymer or oligomer that is crosslinked by photoinitiation.

10. The method of claim 1, wherein the compound, monomer, oligomer, or polymer is an oligomer or monomer that is polymerized by photoinitiation.

11. The method of claim 1, wherein the inorganic transition metal complex is thermally stable.

12. The method of claim 1, wherein the inorganic transition metal complex does not release an anionically charged nucleophile in the absence of light.

13. A method of preparing a lithographic photoresist, stereolithographic media, photocurable coating, adhesive, sealant, or printing ink, comprising applying to a substrate an anionically polymerizable or crosslinkable compound, monomer, oligomer, or polymer, and anionically polymerizing it as claimed in claim 1 under conditions suitable for forming the lithographic photoresist, stereolithographic media, photocurable coating, adhesive, sealant, or printing ink.

14. The method of claim 1, wherein the irradiating causes a ligand field or ligand-to-metal charge transfer transition in the transition metal complex.

15. A method for anionically polymerizing or crosslinking a compound, monomer, oligomer, or polymer, comprising the step of irradiating a mixture of a compound, monomer, oligomer, or polymer and an inorganic transition metal complex selected from the group consisting of optionally substituted ruthenocene complexes comprising at least one Ru atom complexed with two or more cyclopentadienyl moieties, wherein one or more of the cyclopentadienyl groups in the complex is optionally substituted with one or more substituents of the formula —C(O)R, wherein R is a $C_1$ to $C_{10}$ aliphatic group selected from the group consisting of alkyl, alkenyl, or alkynyl, or is aryl, under irradiation conditions sufficient for the inorganic transition metal complex to photochemically react to release a polymerization initiating substance consisting essentially of an anionically charged nucleophile capable of initiating a polymerization or crosslinking reaction of the compound, monomer, oligomer, or polymer.

16. The method of claim 15 wherein the compound, monomer, oligomer, or polymer is selected from the group consisting of ethylene, 1,3-diene, styrene, α-methyl styrene, acrylate ester, methacrylate ester, acrylonitrile, methacrylonitrile, acrylamide, methacrylamide, aldehydes capable of undergoing anionic polymerization or crosslinking, and ketones capable of undergoing anionic polymerization or crosslinking.

17. The method of claim 15, wherein the compound, monomer, oligomer or polymer selected from the group consisting of N-carboxy-α-amino anhydrides, cyclic amides, cyclic esters, epoxides, and siloxanes capable of undergoing anionic ring opening polymerization or crosslinking reactions.

18. The method of claim 15, wherein the inorganic transition metal complex is $(\eta^5-C_5H_5)_2Ru$.

19. The method of claim 18, wherein the compound, monomer, oligomer, or polymer is 2-cyanoethylacrylate.

20. The method of claim 15, wherein the irradiating comprises exposing to near-ultraviolet or visible light.

21. The method of claim 15, wherein the compound, monomer, oligomer, or polymer is a polymer or oligomer that is crosslinked by photoinitiation.

22. The method of claim 15, wherein the compound, monomer, oligomer, or polymer is an oligomer or monomer that is polymerized by photoinitiation.

23. The method of claim 15, wherein the inorganic transition metal complex is thermally stable.

24. The method of claim 15, wherein the inorganic transition metal complex does not release an anionically charged nucleophile in the absence of light.

25. A method of preparing a lithographic photoresist, stereolithographic media, photocurable coating, adhesive, sealant, or printing ink, comprising applying to a substrate an anionically polymerizable or crosslinkable compound, monomer, oligomer, or polymer, and anionically polymerizing it as claimed in claim 13 under conditions suitable for forming the lithographic photoresist, stereolithographic media, photocurable coating, adhesive, sealant, or printing ink.

26. The method of claim 15, wherein the irradiating causes a ligand field or ligand-to-metal charge transfer transition in the inorganic transition metal complex.

* * * * *

UNITED STATES PATENT AND TRADEMARK OFFICE
CERTIFICATE OF CORRECTION

PATENT NO. : 5,877,230
DATED : March 2, 1999
INVENTOR(S) : Charles R. Kutal

It is certified that error appears in the above-identified patent and that said Letters Patent is hereby corrected as shown below:

Cover page, in the abstract, line 9, delete from "FIG 3 to end" in its entirety

Column 2, line 59, delete "lit" after solution

Column 4, line 2, delete "$(n^5\text{-}C_5H_4COR)Fe$" and insert --$(n^5\text{-}C_5H_4COR)_2 Fe$--

Column 5, line 56, delete ">Cl$^{>F\text{-}}$" and insert -->Cl$^-$>F$^-$--

Column 6, line 67, delete "$(NCS)_4^-$" and insert --$(NCS)^-_4$--

Column 7, line 25, delete "$5.4\times10^{-4}$ MM" and insert --$5.4\times10^{-4}$ M--

Column 8, line 14, delete "$(NCS)_4^{1-}$" and insert --$(NCS)_4]^-$--

Column 9, line 25, delete "UV/Vis" and insert --UV/Visible--

Column 10, line 58, delete "($2.92 \times 10^-_4$ M" and insert --($2.92 \times 10^{-4}$ M--

Column 11, line 22, TABLE 3, heading "Amount of Photoinitiator (M/ppm)" delete "$9.30 \times 10^{-4}$/1215" and insert --$9.30 \times 10^{-4}$/215--

UNITED STATES PATENT AND TRADEMARK OFFICE
CERTIFICATE OF CORRECTION

PATENT NO. : 5,877,230
DATED : March 2, 1999
INVENTOR(S) : Charles R. Kutal

It is certified that error appears in the above-identified patent and that said Letters Patent is hereby corrected as shown below:

Column 13, TABLE 6, heading "Time for polymerization$^a$" insert

>610 sec.
5.3 sec.
>1200 sec.
519 sec.
>1890 sec.
460 sec.
>600 sec.
219 sec.

Column 17, line 38, insert --is-- after $A_t$

Column 20, line 2, claim 17, insert --is-- after polymer

Signed and Sealed this

First Day of May, 2001

Attest:

NICHOLAS P. GODICI

Attesting Officer      Acting Director of the United States Patent and Trademark Office